US012684723B2

(12) United States Patent
Chang

(10) Patent No.: US 12,684,723 B2
(45) Date of Patent: Jul. 14, 2026

(54) FIXED STRUCTURE AND ELECTRONIC APPARATUS

(71) Applicant: Getac Technology Corporation, New Taipei City (TW)

(72) Inventor: Kuang-Yeh Chang, Taipei City (TW)

(73) Assignee: Getac Technology Corporation, New Taipei City (TW)

( * ) Notice: Subject to any disclaimer, the term of this patent is extended or adjusted under 35 U.S.C. 154(b) by 241 days.

(21) Appl. No.: 18/610,703

(22) Filed: Mar. 20, 2024

(65) Prior Publication Data

US 2025/0142754 A1     May 1, 2025

(30) Foreign Application Priority Data

Oct. 26, 2023   (CN) .......................... 202311402375.6

(51) Int. Cl.
H05K 7/10         (2006.01)
H05K 7/12         (2006.01)

(52) U.S. Cl.
CPC ................. H05K 7/12 (2013.01); H05K 7/10 (2013.01)

(58) Field of Classification Search
CPC ................................... H05K 7/12; H05K 7/10
USPC ........................................................ 361/748
See application file for complete search history.

(56) References Cited

U.S. PATENT DOCUMENTS 7,134,896 B1 *  11/2006  Chen .................... H05K 7/1404
                                                              439/326
7,182,618 B1 *   2/2007  Choy ................... H05K 7/1404
                                                              439/607.05

7,241,159 B1 *   7/2007  Chen ...................... H01R 13/26
                                                              439/92
8,085,552 B2    12/2011  Takao
2016/0165738 A1   6/2016  Zhu
2020/0244008 A1 *  7/2020  Wu .......................... F16B 21/02
2023/0232563 A1   7/2023  Li

FOREIGN PATENT DOCUMENTS

| CN | 101901974 A | 12/2010 |
|---|---|---|
| CN | 207802619 U | 8/2018 |
| CN | 116893722 A | 10/2023 |
| EP | 2203034 A1 | 6/2010 |
| TW | I543694 B | 7/2016 |

* cited by examiner

*Primary Examiner* — Binh B Tran

(74) *Attorney, Agent, or Firm* — COOPER LEGAL GROUP LLC

(57)                ABSTRACT

A fixed structure is suitable for fixing an electronic module to a mainboard of an electronic apparatus, wherein the electronic module is electrically connected to an insertion slot arranged on the mainboard, and an interval space is present between the electronic module and the mainboard. The fixed structure includes a supporting base and a movable base. The supporting base includes a top, and the top is predefined with a first region and a second region. The movable base includes a positioning body and an elastic clamping portion, and the positioning body is disposed in the first region or the second region. The supporting base is disposed opposite to the insertion slot, part of the supporting base and part of the positioning body disposed thereon are accommodated in the interval space to support part of the electronic module, and the elastic clamping portion clamps one end of the electronic module.

20 Claims, 5 Drawing Sheets

FIXED STRUCTURE AND ELECTRONIC APPARATUS

CROSS-REFERENCE TO RELATED PATENT APPLICATION

This application claims the benefit of priority to China Patent Application No. 202311402375.6, filed on Oct. 26, 2023, in the People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE INVENTION

The present invention relates to a fixed structure, and in particular to a fixed structure configured to fix an electronic module to a mainboard of an electronic apparatus and an electronic apparatus including such fixed structure.

BACKGROUND OF THE INVENTION

Most of the 4G or 5G communication modules currently configured on the market are fixed to the circuit board of the electronic apparatus in a screw-locking manner, where the circuit board must be provided with fixed-position screw holes for the positioning of screws. However, due to the development of communication modules, the sizes of communication modules also change, and communication modules of different generations always have different lengths or sizes. Once the position of the screw holes on the circuit board is restricted, it will be difficult to install the communication module. In addition, the method for locking a communication module with screws requires the assistance of a tool for disassembling and reassembling, which makes it inconvenient to replace the communication module.

SUMMARY OF THE INVENTION

The present invention provides a fixed structure and an electronic apparatus. The fixed structure can be used to fix the electronic module to the mainboard without screws, and the fixed structure can be adjusted based on requirements to fix electronic modules in at least two different sizes.

The fixed structure provided by the present invention is suitable for fixing an electronic module to a mainboard, and the mainboard is provided with an insertion slot. The electronic module has a first end and a second end opposite to each other, the first end is connected to the insertion slot, and an interval space is present between the electronic module and the mainboard. The fixed structure includes a supporting base and a movable base. The supporting base includes a top, and the top is at least predefined with a first region and a second region. The movable base includes a positioning body and an elastic clamping portion. The elastic clamping portion is connected to the positioning body, and the positioning body is disposed in the first region or the second region of the supporting base. The supporting base is opposite to the insertion slot, part of the supporting base and part of the positioning body disposed thereon are accommodated in the interval space to support part of the electronic module, and the elastic clamping portion is suitable for clamping the second end of the electronic module.

In an embodiment of the present invention, the top of the supporting base is provided with a fixed hole, the fixed structure further includes a fastener, and the fastener passes through the fixed holes to fix the supporting base on the mainboard.

In an embodiment of the present invention, the fixed hole is of a countersunk hole structure, and the fastener is a countersunk screw.

In an embodiment of the present invention, the positioning body of the movable base includes a main body, two side portions, and a plurality of clamped portions. The main body has a front edge, a rear edge, and two side edges opposite to each other. The front edge is opposite to the rear edge, the two side portions are respectively disposed on the two side edges, and each side portion is connected to two clamped portions.

In an embodiment of the present invention, the supporting base further includes two side plates respectively connected to two opposite sides of the top, and each side plate is configured with a first clamping groove, a second clamping groove, and a third clamping groove that are spaced apart, wherein the second clamping groove is between the first clamping groove and the third clamping groove. When the clamped portions are clamped at the first clamping grooves and the second clamping grooves, the main body is located in the first region, and when the clamped portions are clamped at the second clamping grooves and the third clamping grooves, the main body is located in the second region.

In an embodiment of the present invention, the elastic clamping portion of the movable base includes an elastic arm, a connecting portion, and an abutting portion. One end of the elastic arm is connected to the rear edge of the main body, and the other end of the elastic arm is connected to one side of the connecting portion. The connecting portion is opposite to the main body, the abutting portion is connected to an opposite side of the connecting portion away from the elastic arm, and the abutting portion is suitable for being abutting against the electronic module.

In an embodiment of the present invention, the movable base further includes a stop pillar, the stop pillar is disposed on the main body and adjacent to the abutting portion, the second end of the electronic module is provided with a notch, and the stop pillar corresponds to the notch.

In an embodiment of the present invention, when the movable base is located in the first region, a first accommodation length is present from the stop pillar to the insertion slot, and when the movable base is located in the second region, a second accommodation length is present from the stop pillar to the insertion slot, wherein the first accommodation length is smaller than the second accommodation length.

In an embodiment of the present invention, part of the first region overlaps part of the second region.

In an embodiment of the present invention, the mainboard includes a first block and a second block apart from each other, the insertion slot is disposed in the first block, and the fixed structure is disposed in the second block.

The electronic apparatus provided by the present invention includes a mainboard, an electronic module, and the foregoing fixed structure. The mainboard is provided with an insertion slot. The electronic module has a first end and a second end opposite to each other, the first end is connected to the insertion slot, and an interval space is present between the electronic module and the mainboard. The fixed structure fixes the electronic module to the mainboard. The fixed structure includes a supporting base and a movable base. The supporting base includes a top and side plates, and the top is at least predefined with a first region and a second region. The movable base includes a positioning body and an elastic clamping portion. The elastic clamping portion is connected to the positioning body, and the positioning body is disposed in the first region or the second region of the supporting base. The supporting base is opposite to the insertion slot, part of the supporting base and part of the positioning body disposed thereon are accommodated in the interval space to support part of the electronic module, and the elastic clamping portion is suitable for clamping the second end of the electronic module.

In the present invention, as the elastic clamping portion is formed on the movable base, and the movable base is movable with respect to the supporting base, different accommodation lengths can be present between the movable base and the insertion slots of the mainboard, and thus are suitable for fixing electronic modules in different sizes. In addition, the elastic clamping portion clamps one end of the electronic module.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
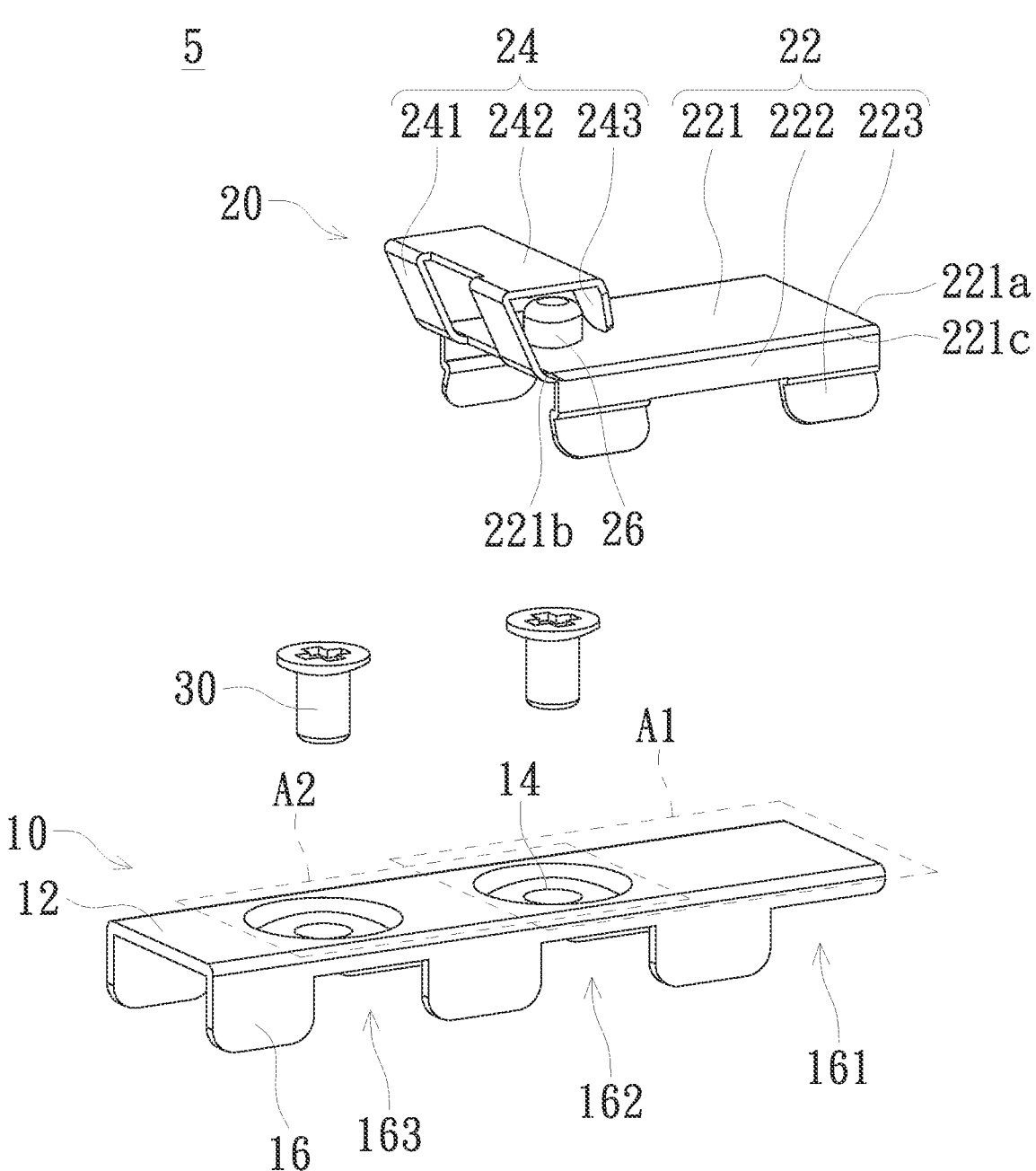
FIG. 1 is a schematic exploded diagram of a fixed structure according to an embodiment of the present invention.
Figure 2:
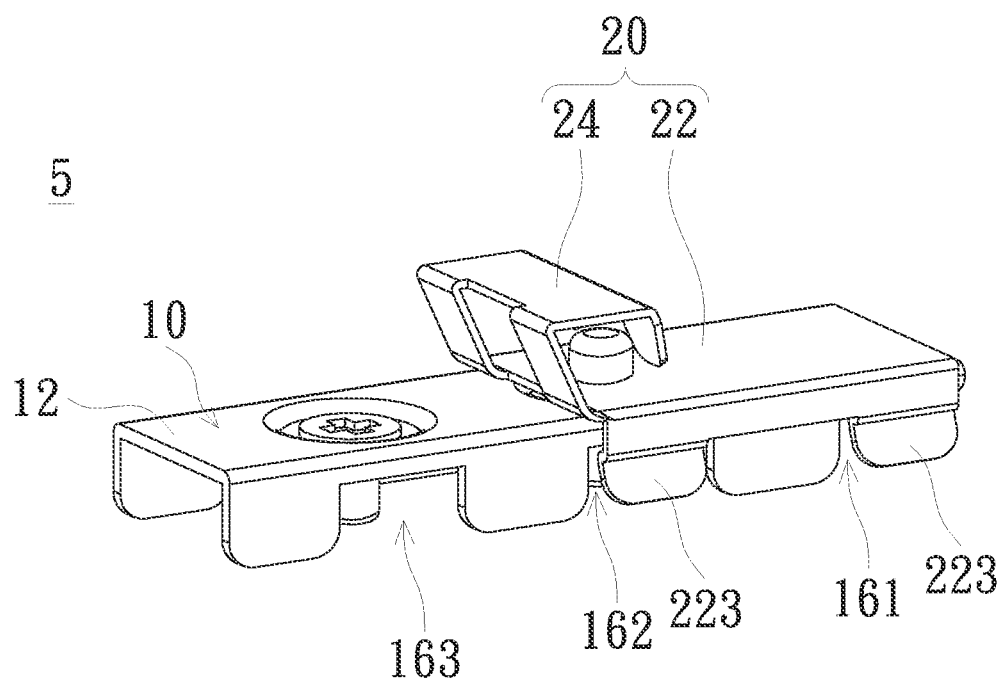
FIG. 2 is a schematic three-dimensional diagram in which a movable base of a fixed structure is located in a first region of a supporting base according to an embodiment of the present invention.
Figure 3:
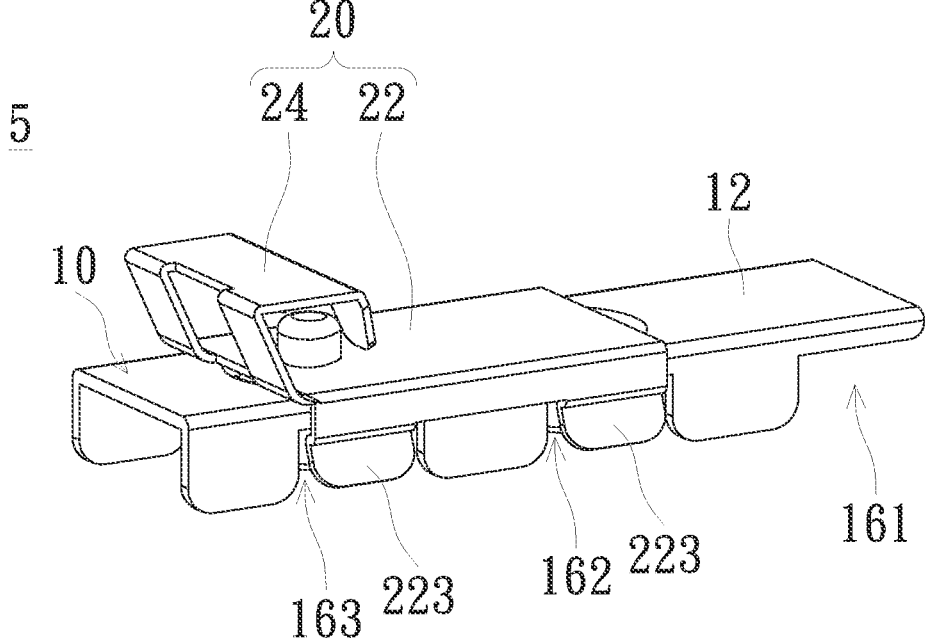
FIG. 3 is a schematic three-dimensional diagram in which a movable base of a fixed structure is located in a second region of a supporting base according to an embodiment of the present invention.

FIG. 1 is a schematic exploded diagram of a fixed structure according to an embodiment of the present invention. As shown in FIG. 1, a fixed structure 5 includes a supporting base 10 and a movable base 20. The supporting base 10 includes a top 12 and two opposite side plates 16. The two opposite side plates 16 are respectively connected to two opposite sides of the top 12, and the top 12 is predefined with a first region A1 and a second region A2. The movable base 20 includes a positioning body 22 and an elastic clamping portion 24, and the elastic clamping portion 24 is connected to the positioning body 22. FIG. 2 is a schematic three-dimensional diagram in which a movable base of a fixed structure is located in a first region of a supporting base according to an embodiment of the present invention. FIG. 3 is a schematic three-dimensional diagram in which a movable base of a fixed structure is located in a second region of a supporting base according to an embodiment of the present invention. As shown in FIGS. 2 and 3, the positioning body 22 of the movable base 20 can be detachably disposed in the first region A1 (shown in FIG. 1) or the second region A2 (shown in FIG. 1) of the supporting base 10 based on requirements.

In an embodiment, still referring to FIG. 1, the positioning body 22 of the movable base 20 includes a main body 221, two opposite side portions 222, and a plurality of clamped portions 223. The main body 221 has a front edge 221a, a rear edge 221b, and two opposite side edges 221c, and the front edge 221a is opposite to the rear edge 221b. The two opposite side portions 222 are respectively connected to two side edges 221c of the main body 221. For example, four clamped portions 223 are provided, of which, two and two are respectively connected to two side portions 222. That is, each side portion 222 is connected to two clamped portions 223. The elastic clamping portion 24 of the movable base 20 is connected to the positioning body 22. In an embodiment, the elastic clamping portion 24 includes an elastic arm 241, a connecting portion 242, and an abutting portion 243. One end of the elastic arm 241 is connected to the rear edge 221b of the main body 221, and the other end of the elastic arm 241 is connected to a side of the connecting portion 242. The connecting portion 242 is opposite to the main body 221. The abutting portion 243 is connected to an opposite side of the connecting portion 242 away from the elastic arm 241. In an embodiment, two elastic arms 241 and two abutting portions 243 are provided, which is not limited thereto. In another embodiment, the movable base 20 further includes a stop pillar 26, and the stop pillar 26 is disposed on the main body 221 and adjacent to the abutting portion 243 and the rear edge 221b of the main body 221, which is not limited thereto.

In addition, as shown in FIG. 1, the two side plates 16 of the supporting base 10 are each provided with a first clamping groove 161, a second clamping groove 162, and a third clamping groove 163 that are spaced apart, wherein the second clamping groove 162 is between the first clamping groove 161 and the third clamping groove 163. Referring to FIG. 2, when the clamped portions 223 of the movable base 20 are clamped at the first clamping grooves 161 and the second clamping grooves 162, and the main body 221 of the movable base 20 is located in the first region A1. Referring to FIG. 3, when the clamped portions 223 of the movable base 20 are clamped at the second clamping grooves 162 and the third clamping grooves 163, and the main body 221 of the movable base 20 is located in the first region A2. In an embodiment, the first region A1 and the second region A2 of the supporting base 10 partially overlap, that is, the first region A1 and the second region A2 both cover the top 12 corresponding to the second clamping groove 162.

The supporting base 10 is made of, for example, stainless steel. The movable base 20 is made of, for example, soft metal plate, which is elastic and allows the side portion 222 and the clamped portion 223 to be deformable, so as to be clamped with the side plate 16 (or the clamping grooves) of the supporting base 10, and the movable base 20 can be easily detached from the supporting base 10 to be readjusted and assembled in a different position of the top 12 of the supporting base 10.

In an embodiment, the top 12 of the supporting base 10 is provided with a fixed hole 14, and the fixed structure 5 further includes a fastener 30. By the fastener 30 passing through the fixed hole 14 and the mainboard 2 as described later, the supporting base 10 can be fixed on the mainboard 2. In an embodiment, the fixed hole 14 is of, for example, a countersunk hole structure, and the fastener 30 is, for example, a countersunk screw.

Figure 4:
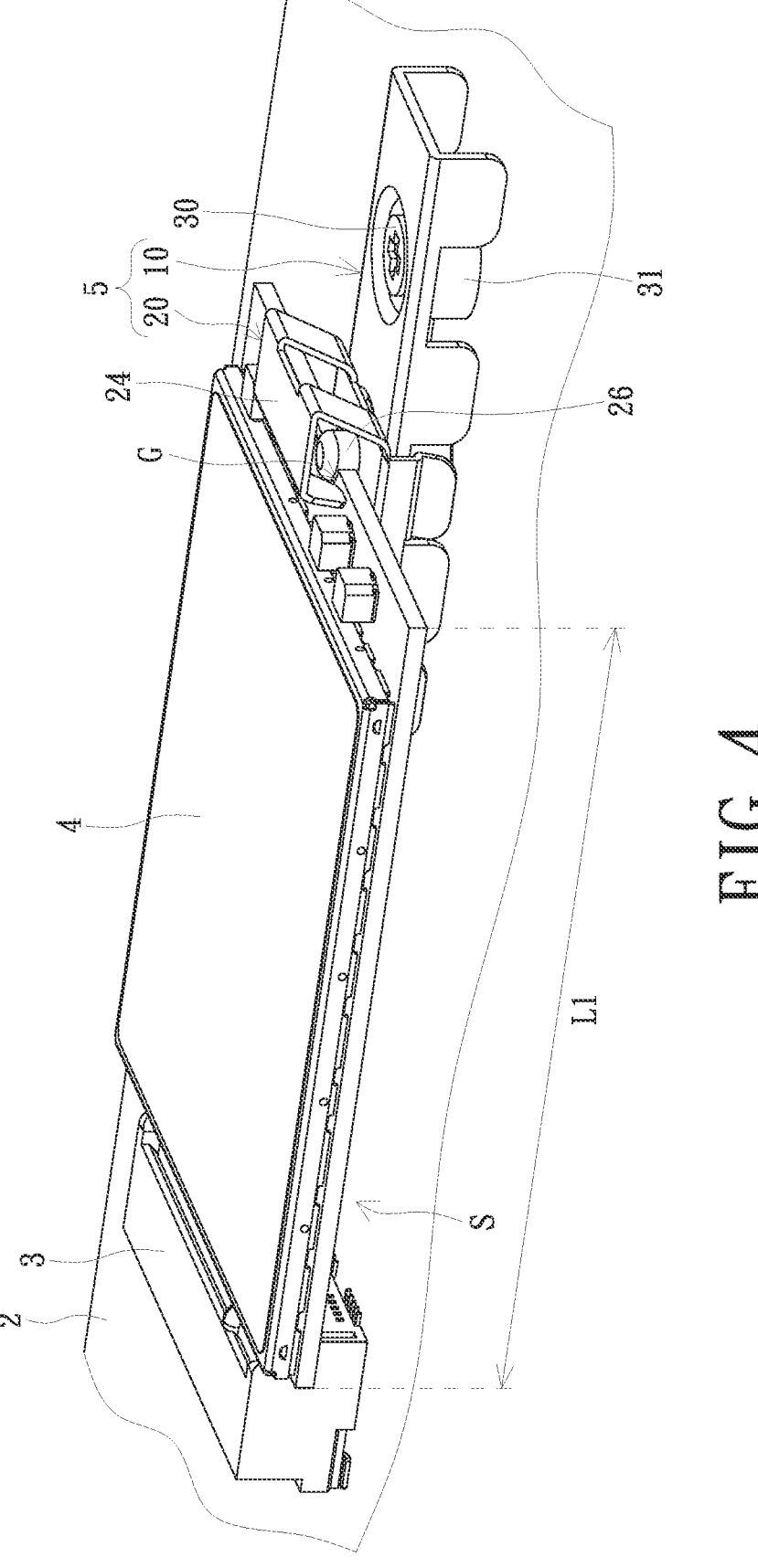
FIG. 4 is a schematic diagram of an application state of a fixed structure according to an embodiment of the present invention.
Figure 5:
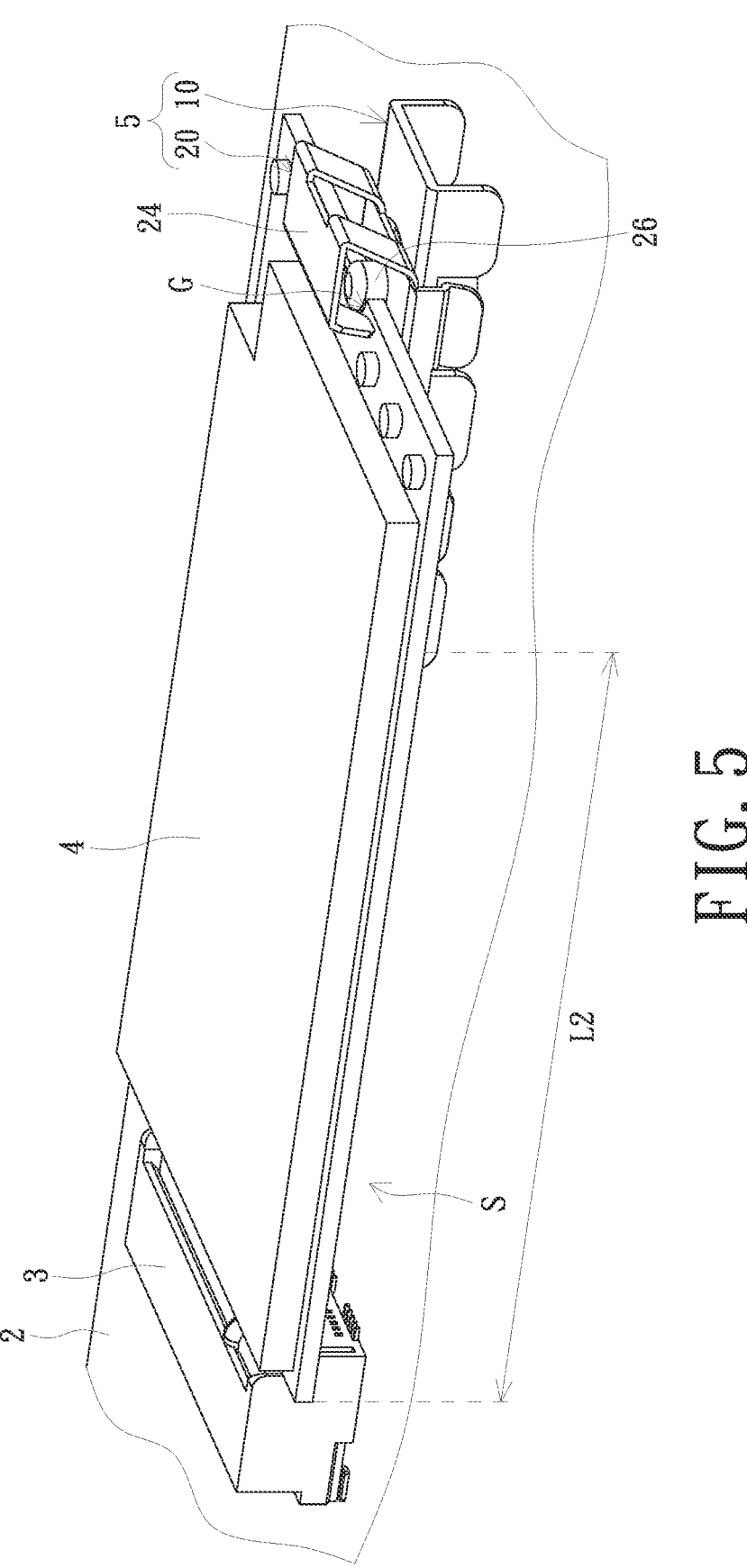
FIG. 5 is a schematic diagram of another application state of a fixed structure according to an embodiment of the present invention.
Figure 6:
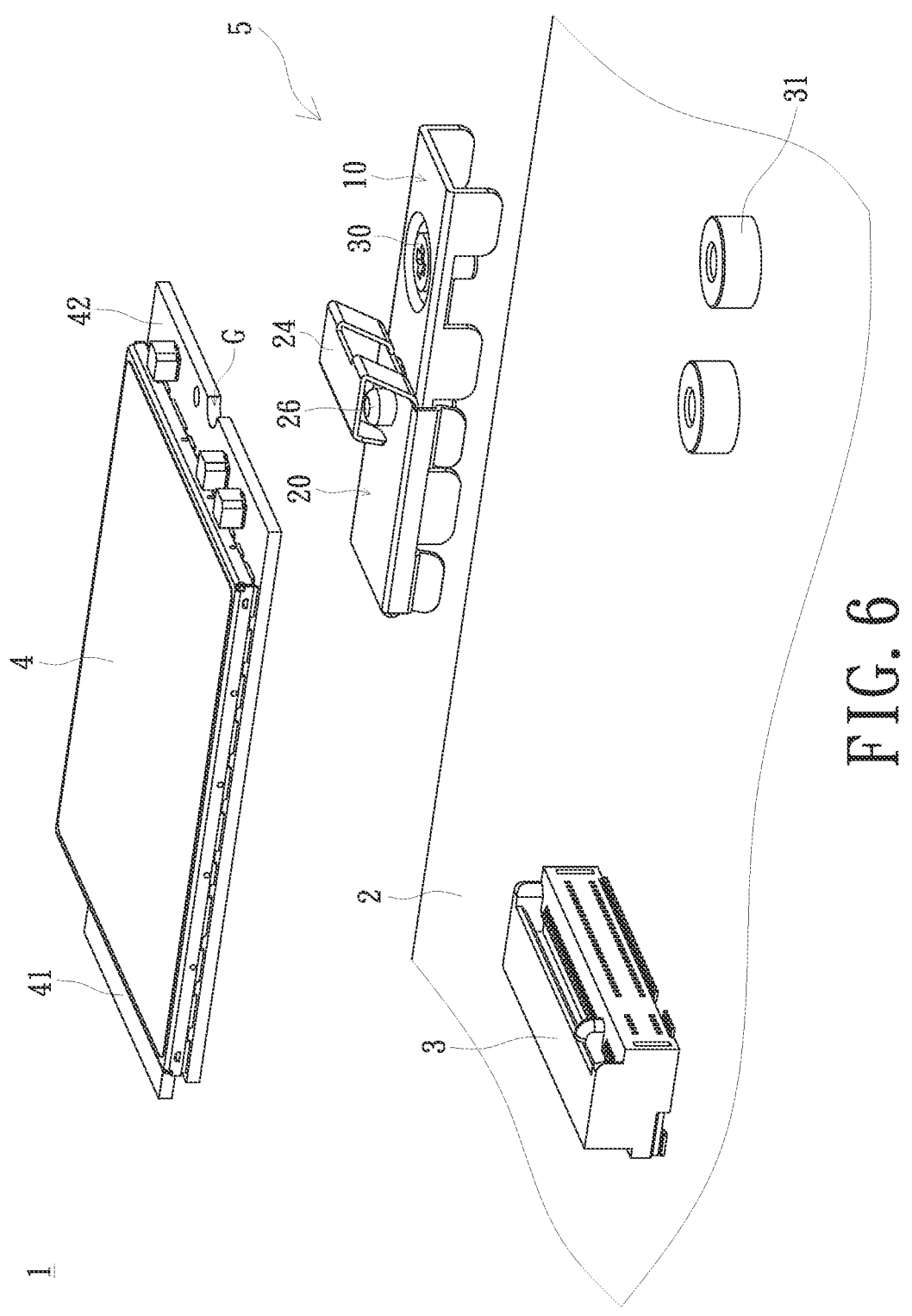
FIG. 6 is a partially schematic exploded view of an electronic apparatus according to an embodiment of the present invention.

FIG. 4 is a schematic diagram of an application state of a fixed structure according to an embodiment of the present invention. FIG. 5 is a schematic diagram of another application state of a fixed structure according to an embodiment of the present invention. FIG. 4 shows the application state of the movable base 20 of the fixed structure 5 being in the first region A1 (shown in FIG. 1) of the supporting base 10, and FIG. 5 is an application state of the movable base 20 of the fixed structure 5 being in the second region A2 (shown in FIG. 1) of the supporting base 10. As shown in FIGS. 4 and 5, the fixed structure 5 is suitable for fixing an electronic module 4 in a different size on the mainboard 2 of the electronic apparatus 1. FIG. 6 is a partially schematic exploded view of an electronic apparatus according to an embodiment of the present invention. As shown in FIG. 6, the electronic apparatus 1 includes a mainboard 2, an electronic module 4, and a fixed structure 5. In an embodiment, the mainboard 2 is provided with an insertion slot 3, the supporting base 10 of the fixed structure 5 is suitable for being disposed opposite to the insertion slot 3, and the mainboard 2 is provided with, for example, a stud 31. Referring to FIGS. 4, 5, and 6, the supporting base 10 is fixed on the mainboard 2 by the fastener 30 passing through the fixed holes 14 and the studs 31. The electronic module 4 has a first end 41 and a second end 42 opposite to each other, the first end 41 is electrically connected to the insertion slot 3, and the second end 42 is disposed on the movable base 20 of the fixed structure 5 to be clamped by the elastic clamping portion 24. Specifically, an interval space S is present between the electronic module 4 and the mainboard 2, and part of the supporting base 10 and part of the movable base 20 disposed thereon are accommodated in the interval space S to support part of the electronic module 4, and the elastic clamping portion 24 clamps the second end 42 of the electronic module 4.

The second end 42 of the electronic module 4 is provided with a notch G, and the shape of the notch G can correspond to a partial contour of the stop pillar 26 of the movable base 20. When the second end 42 of the electronic module 4 is disposed on the movable base 20 of the fixed structure 5, the notch G is engaged with the stop pillar 26, such that the electronic module 4 does not fall off easily, thus enhancing the positioning effect of the electronic module 4.

In an embodiment, the electronic apparatus 1 is, for example, a laptop, a tablet, or a monitor, the mainboard 2 is, for example, a host board or a circuit board of the electronic apparatus 1, and the electronic module 4 is, for example, a 4G or 5G communication module. The present invention is not limited thereto. Generally, the length of the 4G communication module is smaller than the length of the 5G communication module. In another embodiment not shown, the mainboard 2 of the electronic apparatus 1 can include a first block and a second block apart from each other. The insertion slot 3 is, for example, disposed in the first block, and the stud 31 is, for example, disposed in the second block, such that the fixed structure 5 is disposed in the second block. And the electronic module 4 is partially hanged between the insertion slot 3 and the fixed structure 5.

In addition, as shown in FIG. 4, when the movable base 20 is located in the first region A1 of the supporting base 10, a first accommodation length L1 is present from the stop pillar 26 to the insertion slot 3. As shown in FIG. 5, when the movable base 20 is located in the second region A2, a second accommodation length L2 is present from the stop pillar 26 to the insertion slot 3, and the first accommodation length L1 is smaller than the second accommodation length L2. In an embodiment, the first accommodation length L1 is suitable for accommodating the 4G communication module, and the second accommodation length L2 is suitable for accommodating the 5G communication module.

According to the foregoing description, as the elastic clamping portion is formed on the movable base, the movable base is movable with respect to the supporting base, and different accommodation lengths are present between the movable base (or the elastic clamping portion) and the insertion slots of the mainboard, the fixed structure in the embodiments of the present invention can fix electronic modules in different sizes. In addition, as the elastic clamping portion clamps one end of the electronic module, the fixed structure can fix the electronic module to the mainboard of the electronic apparatus without the screw. This may improve the inconvenient replacement caused by the traditional use of screws to lock electronic modules (such as communication modules) that require the assistance of tools to disassemble and assemble.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A fixed structure, suitable for fixing an electronic module to a mainboard, wherein the mainboard is provided with an insertion slot, the electronic module has a first end and a second end opposite to the first end, the first end is connected to the insertion slot, an interval space is present between the electronic module and the mainboard, and the fixed structure comprises:

a supporting base comprising a top, wherein the top is at least predefined with a first region and a second region; and a movable base comprising a positioning body and an elastic clamping portion, wherein the elastic clamping portion is connected to the positioning body, the positioning body is disposed in the first region or the second region of the supporting base, the supporting base is suitable for being disposed opposite to the insertion slot, part of the supporting base and part of the positioning body disposed on the part of the supporting base are accommodated in the interval space to support part of the electronic module, and the elastic clamping portion is suitable for clamping the second end of the electronic module, wherein the positioning body of the movable base comprises a main body, two side portions, and a plurality of clamped portions, the main body has a front edge, a rear edge, and two side edges opposite to each other, the front edge is opposite to the rear edge, the two side portions are respectively disposed on the two side edges, and each of the two side portions is connected to two of the plurality of clamped portions.

2. The fixed structure according to claim 1, wherein the top of the supporting base is provided with at least one fixed hole, the fixed structure further comprises at least one fastener, and the at least one fastener passes through the at least one fixed hole to fix the supporting base on the mainboard.

3. The fixed structure according to claim 2, wherein the at least one fixed hole is of a countersunk hole structure, and the at least one fastener is a countersunk screw.

4. The fixed structure according to claim 1, wherein the supporting base further comprises two side plates respectively connected to two opposite sides of the top, each of the two side plates is configured with a first clamping groove, a second clamping groove, and a third clamping groove that are spaced apart, the second clamping groove is between the first clamping groove and the third clamping groove, when the plurality of clamped portions are clamped at the first clamping grooves and the second clamping grooves, the main body is located in the first region, and when the plurality of clamped portions are clamped at the second clamping grooves and the third clamping grooves, the main body is located in the second region.

5. The fixed structure according to claim 1, wherein the elastic clamping portion of the movable base comprises two elastic arms, one connecting portion, and two abutting portions, one end of each of the two elastic arms is connected to the rear edge of the main body, a second end of each of the two elastic arms is connected to a side of the one connecting portion, the one connecting portion is opposite to the main body, the two abutting portions are respectively connected to two opposite sides of the one connecting portion away from the two elastic arms, and the two abutting portions are suitable for abutting against the electronic module.

6. The fixed structure according to claim 5, wherein the movable base further comprises a stop pillar, the stop pillar is disposed on the main body and adjacent to the two abutting portions of the elastic clamping portion, the second end of the electronic module is provided with a notch, and the stop pillar corresponds to the notch.

7. The fixed structure according to claim 6, wherein when the movable base is located in the first region, a first accommodation length is present from the stop pillar to the insertion slot, when the movable base is located in the second region, a second accommodation length is present from the stop pillar to the insertion slot, and the first accommodation length is smaller than the second accommodation length.

8. The fixed structure according to claim 1, wherein part of the first region overlaps part of the second region.

9. The fixed structure according to claim 1, wherein the mainboard comprises a first block and a second block apart from the first block, the insertion slot is disposed in the first block, and the fixed structure is disposed in the second block.

10. An electronic apparatus, comprising:
a mainboard provided with an insertion slot;
an electronic module having a first end and a second end opposite to the first end, the first end is connected to the insertion slot, and an interval space is present between the electronic module and the mainboard; and

a fixed structure configured to fix the electronic module to the mainboard, wherein the fixed structure comprises:
a supporting base comprising a top, wherein the top is at least predefined with a first region and a second region; and
a movable base comprising a positioning body and an elastic clamping portion, wherein the elastic clamping portion is connected to the positioning body, the positioning body is disposed in the first region or the second region of the supporting base, the supporting base is suitable for being disposed opposite to the insertion slot, part of the supporting base and part of the positioning body disposed on the part of the supporting base are accommodated in the interval space to support part of the electronic module, and the elastic clamping portion is suitable for clamping the second end of the electronic module,
wherein the positioning body of the movable base comprises a main body, two side portions, and a plurality of clamped portions, the main body has a front edge, a rear edge, and two side edges opposite to each other, the front edge is opposite to the rear edge, the two side portions are respectively disposed on the two side edges, and each of the two side portions is connected to two of the plurality of clamped portions.

11. The electronic apparatus according to claim 10, wherein the top of the supporting base is provided with at least one fixed hole, the fixed structure further comprises at least one fastener, and the at least one fastener passes through the at least one fixed hole to fix the supporting base on the mainboard.

12. The electronic apparatus according to claim 11, wherein the at least one fixed hole is of a countersunk hole structure, and the at least one fastener is a countersunk screw.

13. The electronic apparatus according to claim 10, wherein the supporting base further comprises two side plates respectively connected to two opposite sides of the top, each of the two side plates is configured with a first clamping groove, a second clamping groove, and a third clamping groove that are spaced apart, the second clamping groove is between the first clamping groove and the third clamping groove, when the plurality of clamped portions are clamped at the first clamping grooves and the second clamping grooves, the main body is located in the first region, and when the plurality of clamped portions are clamped at the second clamping grooves and the third clamping grooves, the main body is located in the second region.

14. A fixed structure, suitable for fixing an electronic module to a mainboard, wherein the mainboard is provided with an insertion slot, the electronic module has a first end and a second end opposite to the first end, the first end is connected to the insertion slot, an interval space is present between the electronic module and the mainboard, and the fixed structure comprises:
a supporting base comprising a top, wherein the top is at least predefined with a first region and a second region; and
a movable base comprising a positioning body and an elastic clamping portion, wherein the elastic clamping portion is connected to the positioning body, the positioning body is disposed in the first region or the second region of the supporting base, the supporting base is suitable for being disposed opposite to the insertion slot, part of the supporting base and part of the positioning body disposed on the part of the supporting base are accommodated in the interval space to support part of the electronic module, and the elastic clamping portion is suitable for clamping the second end of the electronic module, wherein the top of the supporting base is provided with at least one fixed hole, the fixed structure further comprises at least one fastener, and the at least one fastener passes through the at least one fixed hole to fix the supporting base on the mainboard, and wherein the at least one fixed hole is of a countersunk hole structure, and the at least one fastener is a countersunk screw.

15. The fixed structure according to claim 14, wherein the positioning body of the movable base comprises a main body and a plurality of clamped portions, the supporting base further comprises two side plates respectively connected to two opposite sides of the top, each of the two side plates is configured with a first clamping groove, a second clamping groove, and a third clamping groove that are spaced apart, the second clamping groove is between the first clamping groove and the third clamping groove, when the plurality of clamped portions are clamped at the first clamping grooves and the second clamping grooves, the main body is located in the first region, and when the plurality of clamped portions are clamped at the second clamping grooves and the third clamping grooves, the main body is located in the second region.

16. The fixed structure according to claim 14, wherein the positioning body of the movable base comprises a main body, the elastic clamping portion of the movable base comprises two elastic arms, one connecting portion, and two abutting portions, one end of each of the two elastic arms is connected to a rear edge of the main body, a second end of each of the two elastic arms is connected to a side of the one connecting portion, the one connecting portion is opposite to the main body, the two abutting portions are respectively connected to two opposite sides of the one connecting portion away from the two elastic arms, and the two abutting portions are suitable for abutting against the electronic module.

17. The fixed structure according to claim 16, wherein the movable base further comprises a stop pillar, the stop pillar is disposed on the main body and adjacent to the two abutting portions of the elastic clamping portion, the second end of the electronic module is provided with a notch, and the stop pillar corresponds to the notch.

18. The fixed structure according to claim 17, wherein when the movable base is located in the first region, a first accommodation length is present from the stop pillar to the insertion slot, when the movable base is located in the second region, a second accommodation length is present from the stop pillar to the insertion slot, and the first accommodation length is smaller than the second accommodation length.

19. The fixed structure according to claim 14, wherein part of the first region overlaps part of the second region.

20. The fixed structure according to claim 14, wherein the mainboard comprises a first block and a second block apart from the first block, the insertion slot is disposed in the first block, and the fixed structure is disposed in the second block.

* * * * *